United States Patent
Abe

(10) Patent No.: US 10,741,359 B2
(45) Date of Patent: Aug. 11, 2020

(54) ELECTRON MICROSCOPE AND CONTROL METHOD

(71) Applicant: JEOL Ltd., Tokyo (JP)

(72) Inventor: Akira Abe, Tokyo (JP)

(73) Assignee: JEOL Ltd., Tokyo (JP)

( * ) Notice: Subject to any disclaimer, the term of this patent is extended or adjusted under 35 U.S.C. 154(b) by 333 days.

(21) Appl. No.: 15/972,744

(22) Filed: May 7, 2018

(65) Prior Publication Data

US 2018/0330917 A1 Nov. 15, 2018

(30) Foreign Application Priority Data

May 9, 2017 (JP) ................................. 2017-092904

(51) Int. Cl.
```
H01J 37/28      (2006.01)
H01J 37/147     (2006.01)
H01J 37/22      (2006.01)
H01J 37/252     (2006.01)
G01N 23/225     (2018.01)
```
(Continued)

(52) U.S. Cl.
CPC ............ H01J 37/28 (2013.01); G01N 23/225 (2013.01); G06T 7/11 (2017.01); G06T 7/136 (2017.01); H01J 37/147 (2013.01); H01J 37/222 (2013.01); H01J 37/252 (2013.01); G06T 2200/24 (2013.01); G06T 2207/10061 (2013.01); G06T 2207/20104 (2013.01); H01J 2237/225 (2013.01); H01J 2237/2803 (2013.01); H01J 2237/2807 (2013.01)

(58) Field of Classification Search
CPC ........ H01J 37/28; H01J 37/147; H01J 37/252; H01J 2237/225; H01J 2237/2803; H01J 2237/2807; G06T 7/136; G06T 7/11; G06T 2200/24; G06T 2207/10061; G06T 2207/20104; G01N 23/225
USPC .......................... 250/306, 307, 309, 310, 311
See application file for complete search history.

(56) References Cited

U.S. PATENT DOCUMENTS

| 2006/0011836 A1* | 1/2006 | Kaji ..................... H01J 37/256 250/310 |
| 2013/0188846 A1 | 7/2013 | Kriston et al. |

(Continued)

FOREIGN PATENT DOCUMENTS

| JP | 20037245 A | 1/2003 |
| JP | 3654551 B2 | 6/2005 |

OTHER PUBLICATIONS

Examination Report issued in EP18171519.4 dated Feb. 24, 2020.
(Continued)

Primary Examiner — Nicole M Ippolito
(74) Attorney, Agent, or Firm — The Webb Law Firm

(57) ABSTRACT

An electron microscope includes: a display control unit which sequentially acquires electron microscope images of a sample and causes a display unit to display the electron microscope images as a live image; an analysis area setting unit which sets an analysis area on the sample based on a designated position on the live image designated by pointing means; and an analysis control unit which performs control for executing elemental analysis of the set analysis area. The analysis area setting unit sets, as the analysis area, an area on the sample which corresponds to a continuous area including the designated position and having brightness comparable to brightness of the designated position.

5 Claims, 5 Drawing Sheets

(51) Int. Cl.
*G06T 7/00* (2017.01)
*G06T 7/136* (2017.01)
*G06T 7/11* (2017.01)

(56) References Cited

U.S. PATENT DOCUMENTS

2016/0313905 A1   10/2016   Tachibana et al.
2017/0140897 A1*  5/2017   Phaneuf ................. H01J 37/26
2019/0279838 A1*  9/2019   Shigeto ................. H01J 37/285

OTHER PUBLICATIONS

Preetha et al., "Image Segmentation Using Seeded Region Growing", International Conference on Computing, Electronics and Electrical Technologies, 2012, 576-583.
Extended European Search Report dated Oct. 12, 2018 in EP18171519.4.

* cited by examiner

ELECTRON MICROSCOPE AND CONTROL METHOD

CROSS-REFERENCE TO RELATED APPLICATION

This application claims priority to Japanese Patent Application No. 2017-092904 filed May 9, 2017, the disclosure of which is hereby incorporated in its entirety by reference.

BACKGROUND OF THE INVENTION

Field of the Invention

The present invention relates to an electron microscope and a control method.

Description of Related Art

Conventionally, scanning electron microscopes provided with an X-ray analyzer are known (for example, JP-A-2003-007245). With such an electron microscope, elemental analysis of a sample can be performed using an energy-dispersive X-ray spectrometer (EDS) mounted on the electron microscope.

With a conventional electron microscope capable of performing elemental analysis, a user saves an observed image (an electron microscope image) before designating an analysis area and designates the analysis area on the saved observed image. Therefore, a large burden is placed upon the user when changing an observed field and designating an analysis area or when changing an observed image (for example, from a secondary electron image to a backscattered electron image) and designating an analysis area because the user must designate the analysis area only after changing an observation condition and once again saving an observed image. In addition, since an analysis area is designated on a saved observed image, an analysis area cannot be set in a plurality of observed fields.

SUMMARY OF THE INVENTION

The invention provides an electron microscope and a control method capable of reducing a burden placed on a user when setting an analysis area.

According to a first aspect of the invention, there is provided an electron microscope for performing elemental analysis of a sample, the electron microscope including:

a display control unit which sequentially acquires electron microscope images of the sample and causes a display unit to display the electron microscope images as a live image;

an analysis area setting unit which sets an analysis area on the sample based on a designated position on the live image designated by pointing means; and an analysis control unit which performs control for executing elemental analysis of the set analysis area, wherein the analysis area setting unit sets, as the analysis area, an area on the sample which corresponds to a continuous area including the designated position and having brightness comparable to brightness of the designated position.

According to a second aspect of the invention, there is provided a control method for controlling an electron microscope which performs elemental analysis of a sample, the control method including:

sequentially acquiring electron microscope images of the sample and causing a display unit to display the electron microscope images as a live image;

setting an analysis area on the sample based on a designated position on the live image designated by pointing means; and performing control for executing elemental analysis of the set analysis area, wherein, in setting an analysis area, an area on the sample which corresponds to a continuous area including the designated position and having brightness comparable to brightness of the designated position is set as the analysis area.

Figure 1:
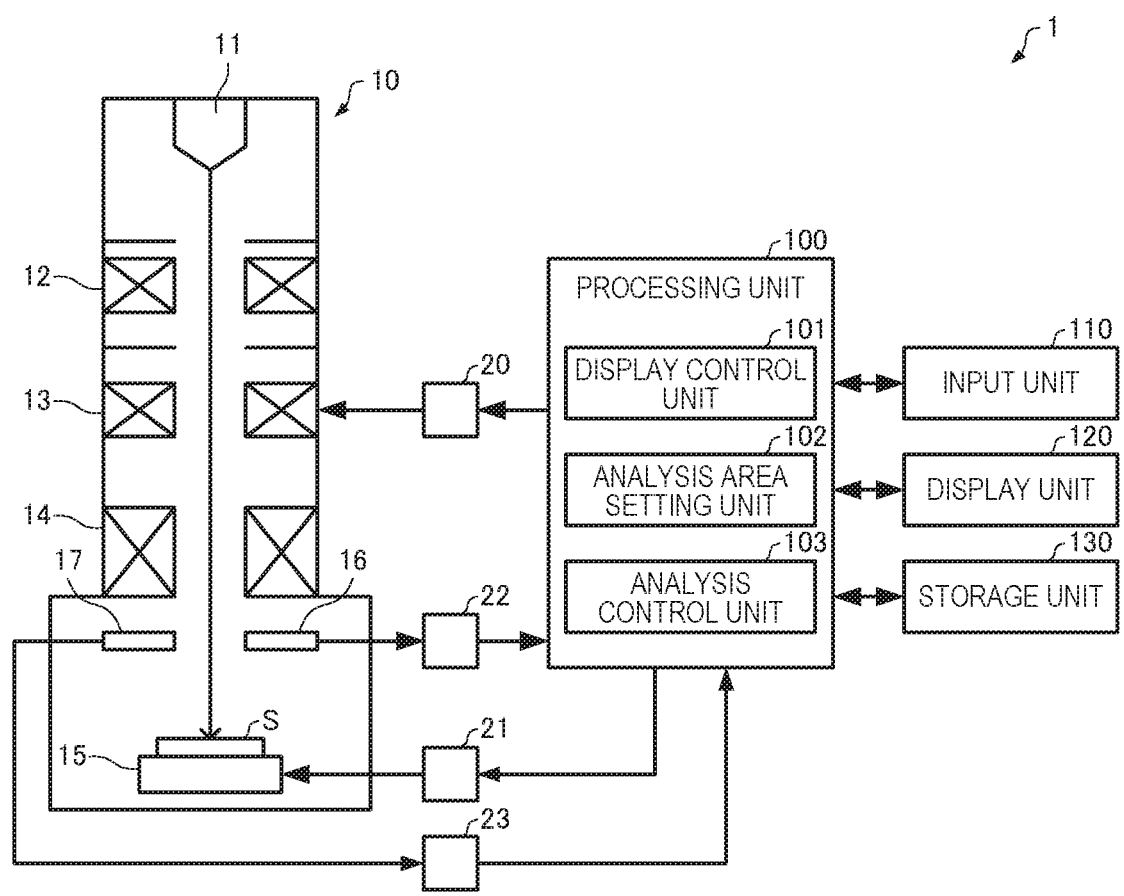
FIG. 1 is a diagram illustrating an example of a configuration of an electron microscope according to an embodiment of the invention.

DESCRIPTION OF THE INVENTION (1) According to one embodiment of the invention, there is provided an electron microscope for performing elemental analysis of a sample, the electron microscope including:

a display control unit which sequentially acquires electron microscope images of the sample and causes a display unit to display the electron microscope images as a live image;

an analysis area setting unit which sets an analysis area on the sample based on a designated position on the live image designated by pointing means; and an analysis control unit which performs control for executing elemental analysis of the set analysis area, wherein the analysis area setting unit sets, as the analysis area, an area on the sample which corresponds to a continuous area including the designated position and having brightness comparable to brightness of the designated position.

According to one embodiment of the invention, there is provided a control method for controlling an electron microscope which performs elemental analysis of a sample, the control method including:

sequentially acquiring electron microscope images of the sample and causing a display unit to display the electron microscope images as a live image;

setting an analysis area on the sample based on a designated position on the live image designated by pointing means; and performing control for executing elemental analysis of the set analysis area, wherein, in setting an analysis area, an area on the sample which corresponds to a continuous area including the designated position and having brightness comparable to brightness of the designated position is set as the analysis area.

According to the electron microscope and the control method described above, since an operation for setting an analysis area can be performed on a live image, the effort of rephotographing an image and the like can be saved and a burden placed on a user when setting an analysis area can be reduced. In addition, the user can automatically set an analysis area and can also set an analysis area in a plurality of observed fields by simply performing an operation of designating any position on a live image.

(2) In the electron microscope described above, the analysis area setting unit may set, as the analysis area, an area on the sample which corresponds to an area adjacent to an area including the designated position when a difference between brightness of the area including the designated position and brightness of the adjacent area is equal to or smaller than a predetermined threshold.

In the control method described above, in setting an analysis area, an area on the sample which corresponds to an area adjacent to an area including the designated position may be set as the analysis area when a difference between brightness of the area including the designated position and brightness of the adjacent area is equal to or smaller than a predetermined threshold.

(3) In the electron microscope described above, the analysis area setting unit may set the threshold based on an input by a user.

In the control method described above, in setting an analysis area, the threshold may be set based on an input by a user.

(4) In the electron microscope described above, the analysis control unit may scan the set analysis area with an electron beam and acquire a spectrum based on a detection signal of radiation detected during the scan.

In the control method described above, in performing control, the set analysis area may be scanned with an electron beam and a spectrum based on a detection signal of radiation detected during the scan may be acquired.

Preferable embodiments of the invention are described in detail below with reference to the drawings. Note that the following embodiments do not unduly limit the scope of the invention as stated in the claims. In addition, all of the elements described in connection with the following embodiments should not necessarily be taken as essential requirements of the invention.

1. Configuration

FIG. 1 is a diagram illustrating an example of a configuration of an electron microscope according to one embodiment of the invention. While a case where the electron microscope has a configuration of a scanning electron microscope (SEM) will be described below, alternatively, the electron microscope may have a configuration of a scanning transmission electron microscope (STEM). In addition, while an electron microscope provided with an energy-dispersive X-ray spectrometer (EDS or EDX) will be described below as an example of an electron microscope which performs elemental analysis of a sample, the invention can also be applied to an electron microscope provided with a wavelength-dispersive X-ray spectrometer (WDS) or an Auger electron microscope (AES). It is noted that some of the components of the electron microscope illustrated in FIG. 1 may be omitted.

As illustrated in FIG. 1, an electron microscope 1 includes an electron microscope body 10, a processing unit 100, an input unit 110, a display unit 120, and a storage unit 130.

The electron microscope body 10 is provided with an electron source 11, a condenser lens 12, a deflector 13, an objective lens 14, a sample stage 15, an electron detector 16, an EDS detector 17, a deflector controller 20, a stage controller 21, an amplifier 22, and a multichannel pulse-height analyzer 23.

The electron source 11 generates an electron beam. The electron source 11 is, for example, an electron gun which accelerates electrons emitted from a cathode at an anode and which emits an electron beam.

The condenser lens 12 is a lens for causing an electron beam emitted from the electron source 11 to converge to form an electron probe. A diameter and a probe current (a probe current amount) of the electron probe can be controlled by the condenser lens 12.

The objective lens 14 is a lens for forming an electron probe arranged immediately in front of a sample S. For example, the objective lens 14 is configured so as to include a coil and a yoke. In the objective lens 14, magnetic lines created by the coil are encased in the yoke made of a material with high magnetic permeability such as iron, and the densely-distributed magnetic lines are leaked onto an optical axis by creating a notch (a lens cap) in a part of the yoke.

The deflector 13 (a scanning coil) deflects an electron probe (an electron beam) formed by the condenser lens 12 and the objective lens 14. The deflector 13 is used in order to scan a surface of the sample S with the electron probe. The deflector 13 is also used to move the electron probe to any position on the sample S and irradiate the position with the electron probe. The deflector 13 is controlled by the deflector controller 20.

The sample stage 15 holds the sample S and moves the sample S in horizontal and vertical directions. The sample stage 15 has a drive mechanism for moving the sample S and is controlled by the stage controller 21.

The electron detector 16 detects a secondary electron or a backscattered electron emitted from the sample S when the sample S is irradiated (scanned) by the electron probe. An output signal of the electron detector 16 (an intensity signal of a secondary electron or a backscattered electron) is amplified by the amplifier 22 and then supplied to the processing unit 100.

The EDS detector 17 detects a characteristic X-ray (an example of radiation) generated from the sample S when the sample S is irradiated (scanned) by the electron probe. An output signal of the EDS detector 17 is sent to the multichannel pulse-height analyzer 23.

The multichannel pulse-height analyzer 23 (a multichannel analyzer) is a pulse-height analyzer having a plurality of channels. The multichannel pulse-height analyzer 23 generates EDS spectral information by counting output signals (output pulses) of the EDS detector 17 for each X-ray energy level, and outputs the EDS spectral information to the processing unit 100.

The input unit 110 enables the user to input operation information, and outputs input operation information to the processing unit 100. Functions of the input unit 110 can be realized by a touch panel (an example of pointing means). The touch panel detects a coordinate value of a touched position (a designated position) input by a touch operation (a designating operation) with respect to the touch panel and outputs the coordinate value to the processing unit 100. Moreover, a pointing device such as a mouse may be used as the pointing means.

The display unit 120 outputs an image generated by the processing unit 100, and functions of the display unit 120 can be realized by a touch panel which also functions as the input unit 110, an LCD, a CRT, and the like.

The storage unit 130 stores programs and various pieces of data which enable a computer to function as the respective units of the processing unit 100 and also functions as a work area of the processing unit 100, and the functions of the storage unit 130 can be realized by a hard disk, a RAM, and the like.

The processing unit 100 performs processes for controlling the deflector controller 20, the stage controller 21, and the like, processes for acquiring an electron microscope image and an EDS spectrum, and processes for display control and the like. Functions of the processing unit 100 can be realized by hardware including various processors (a CPU, a DSP, or the like) and by programs. The processing unit 100 includes a display control unit 101, an analysis area setting unit 102, and an analysis control unit 103.

The display control unit 101 acquires an electron microscope image (a scanning electron microscope image or an SEM image) of the sample S by synchronizing a detection signal amplified by the amplifier 22 with a scanning signal and imaging the synchronized signal. By sequentially acquiring, in real time, electron microscope images at a predetermined frame rate and sequentially outputting the acquired electron microscope images to the display unit 120, the display control unit 101 causes a live image of the sample S to be displayed on the touch panel (the display unit 120).

The analysis area setting unit 102 sets an analysis area on the sample S based on a designated position on the live image having been designated using the touch panel (the input unit 110) by the user. More specifically, the analysis area setting unit 102 sets an area on the sample S which corresponds to a continuous area (an area on the live image) including the designated position and having brightness comparable to brightness of the designated position as an analysis area. Coordinate information (a coordinate value in a coordinate system of the sample stage 15) of the set analysis area is stored in the storage unit 130 in association with, for example, identification information (an ID) of the analysis area.

The analysis control unit 103 performs control for executing elemental analysis of the set analysis area. More specifically, the analysis control unit 103 controls the deflector controller 20 based on the coordinate information of the analysis area stored in the storage unit 130, scans the inside of the set analysis area with an electron beam, and acquires an EDS spectrum of the analysis area based on EDS spectral information output from the multichannel pulse-height analyzer 23 during the scanning.

2. Method

Next, a method according to one embodiment of the invention will be described with reference to the drawings.

Figure 2:
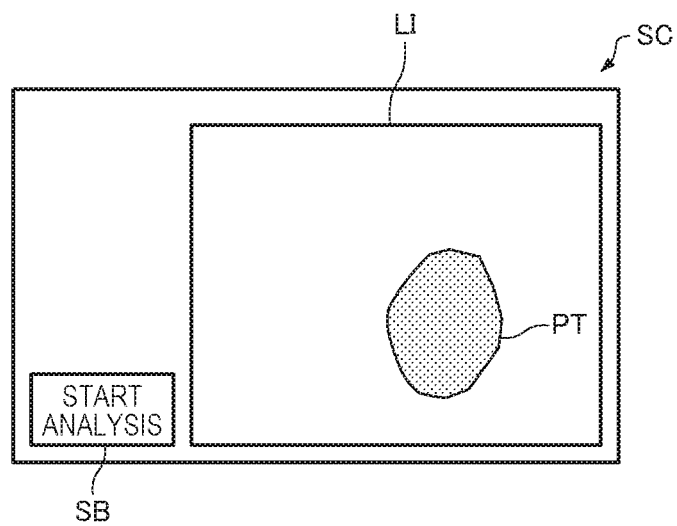
FIG. 2 illustrates an example of a display screen of a touch panel.
Figure 3A:
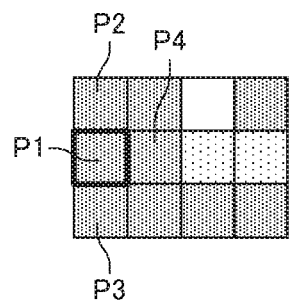
FIGS. 3A to 3D are diagrams schematically illustrating each pixel constituting a part of a live image.
Figure 3B:
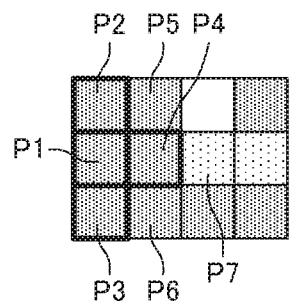
Figure 3C:
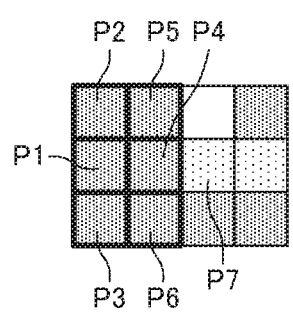
Figure 3D:
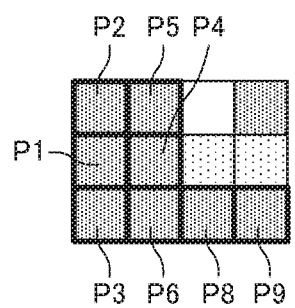

FIG. 2 illustrates an example of a display screen SC of a touch panel (the input unit 110 and the display unit 120). A live image LI is displayed on the display screen SC. The live image LI is a scanning electron microscope image which is constantly updated at a predetermined frame rate (for example, 1/60 second intervals). In this case, an image of a particle PT that is a sample is displayed as the live image LI.

By performing an operation which involves touching the display screen SC with a fingertip (or a touch pen or the like) and designating any position on the live image LI, the user can set an area (an analysis area) on the sample to be a target of elemental analysis by EDS. Specifically, when the user performs an operation of designating any position on the live image LI, an area on the sample which corresponds to a continuous area including the position designated on the live image LI (the designated position) and having brightness comparable to brightness of the designated position is set as an analysis area.

An example of a method of setting an analysis area will be described with reference to FIGS. 3A to 3D. FIGS. 3A to 3D are diagrams schematically illustrating each pixel constituting a part of the live image LI. A density of hatching of each pixel depicted by a rectangle in FIGS. 3A to 3D indicates brightness of each pixel. Let us now assume that a position designated by the user is a pixel P1. In this case, first, the pixel P1 including the designated position is set as an area on the live image LI which corresponds to the analysis area (refer to FIG. 3A). Next, brightness of the pixel P1 is respectively compared with brightnesses of pixels P2, P3, and P4 which are adjacent to the pixel P1, and pixels of which a brightness difference from the pixel P1 is equal to or smaller than a predetermined threshold (in this case, the pixels P2, P3, and P4) are set as an area which corresponds to the analysis area (refer to FIG. 3B). Next, the brightness of the pixel P4 (or the pixel P2) is compared with brightness of an adjacent pixel P5, the brightness of the pixel P4 (or the pixel P3) is compared with brightness of an adjacent pixel P6, and the brightness of the pixel P4 is compared with brightness of an adjacent pixel P7, and pixels of which a brightness difference from the pixel P4 (or the pixel P2 or P3) is equal to or smaller than the predetermined threshold (in this case, the pixels P5 and P6) are set as an area which corresponds to the analysis area (refer to FIG. 3C). Thereafter, in a similar manner, pixels which are adjacent to a pixel set as an area which corresponds to the analysis area and of which a brightness difference from the set pixel is equal to or smaller than the predetermined threshold are sequentially set as an area which corresponds to the analysis area. This process is continued until a group of pixels set as an area which corresponds to the analysis area becomes surrounded by pixels with a brightness difference exceeding the predetermined threshold or until a determination (a comparison) of all pixels constituting the live image LI is completed. In the example illustrated in FIGS. 3A to 3D, an area on the sample which corresponds to an area (a group of pixels) constituted by the pixels P1 to P6, P8, and P9 on the live image LI is set as the analysis area (refer to FIG. 3D).

Figure 4:
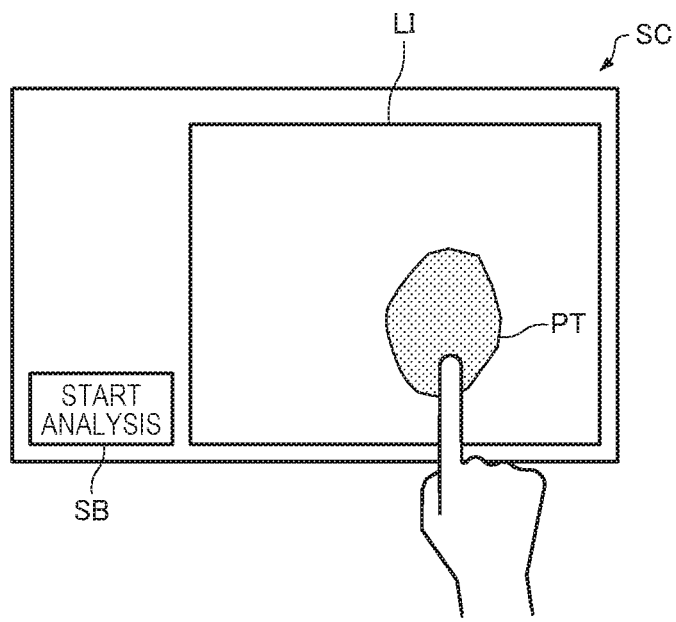
FIG. 4 illustrates an example of a display screen of a touch panel.

For example, since the particle PT is displayed with approximately uniform brightness in the live image LI, when the user performs an operation of designating a position at which the particle PT is displayed on the live image LI as illustrated in FIG. 4, an area on the sample which corresponds to the display area of the particle PT on the live image LI is automatically set as an analysis area. In this manner, an analysis area for analyzing a particle in a sample can be readily set with a simple operation.

By performing a predetermined operation (for example, by operating a GUI displayed on the touch panel), the user can change an observed field (move the observed field or change an observation magnification). When the observed field is changed, electron microscope images of the changed observed field are displayed as the live image LI, and the user can set an analysis area on the live image LI with the changed observed field. In other words, by performing an operation of designating any position on the live image LI every time the observed field is changed, the user can set a plurality of analysis areas in different observed fields. Coordinate information of a set analysis area is stored in the storage unit 130 every time an analysis area is set.

The display screen SC displays an analysis start button SB for starting an analysis. When the user performs an operation of designating the analysis start button SB, acquisition of the live image LI (scanning of the entire observed field by an electron beam) is stopped and elemental analysis of each set analysis area is executed. Specifically, the deflector controller 20 (and, when necessary, the stage controller 21) is controlled based on coordinate information of each analysis area stored in the storage unit 130 and each analysis area is scanned by an electron beam, and an EDS spectrum of each analysis area is acquired.

As described above, according to the electron microscope, since an operation for setting an analysis area on the live image LI can be performed without having to save an electron microscope image every time, simply designating any position on the live image LI enables an area on a sample which corresponds to a continuous area having brightness comparable to brightness of the designated position to be automatically set as an analysis area, and analysis areas can be set in a plurality of observed fields while changing the observed fields, a burden placed on the user when setting an analysis area can be reduced.

Moreover, the threshold used when setting an analysis area may be arbitrarily set by the user by performing a predetermined operation (for example, by operating a GUI displayed on the touch panel). In this case, when the user arbitrarily sets one threshold T and an absolute value of a difference $(I_A-I_B)$ between brightness $I_A$ of a pixel set as an area which corresponds to an analysis area and brightness $I_B$ of an adjacent pixel is equal to or smaller than the threshold T, the adjacent pixel may be set as an area which corresponds to the analysis area. In addition, when the user respectively arbitrarily sets a first threshold $T_1$ that is a lower limit value and a second threshold $T_2$ that is an upper limit value and an absolute value of the difference $(I_A-I_B)$ between the brightness $I_A$ of a pixel set as an area which corresponds to an analysis area and the brightness $I_B$ of an adjacent pixel is equal to or larger than the threshold $T_1$ and equal to or smaller than the threshold $T_2$, the adjacent pixel may be set as an area which corresponds to the analysis area.

Furthermore, when setting an analysis area, brightnesses among areas constituted by a plurality of pixels may be compared with one another instead of comparing brightnesses among pixels with one another. For example, average brightness of an area having a predetermined shape and including a designated position may be compared with average brightness of an adjacent area with a same shape. In this case, a configuration may be adopted in which a shape (for example a rectangle or a circle) and a size of the area from which reference brightness is to be extracted can be arbitrarily set by the user by performing a predetermined operation (for example, by operating a GUI displayed on the touch panel).

In addition, when setting an analysis area, the live image LI may be binarized to generate a binary image, and an area on the sample which corresponds to a continuous area including the designated position on the binary image and having same brightness as the brightness (0 or 1) of the designated position may be set as an analysis area.

3. Processes

Figure 5:
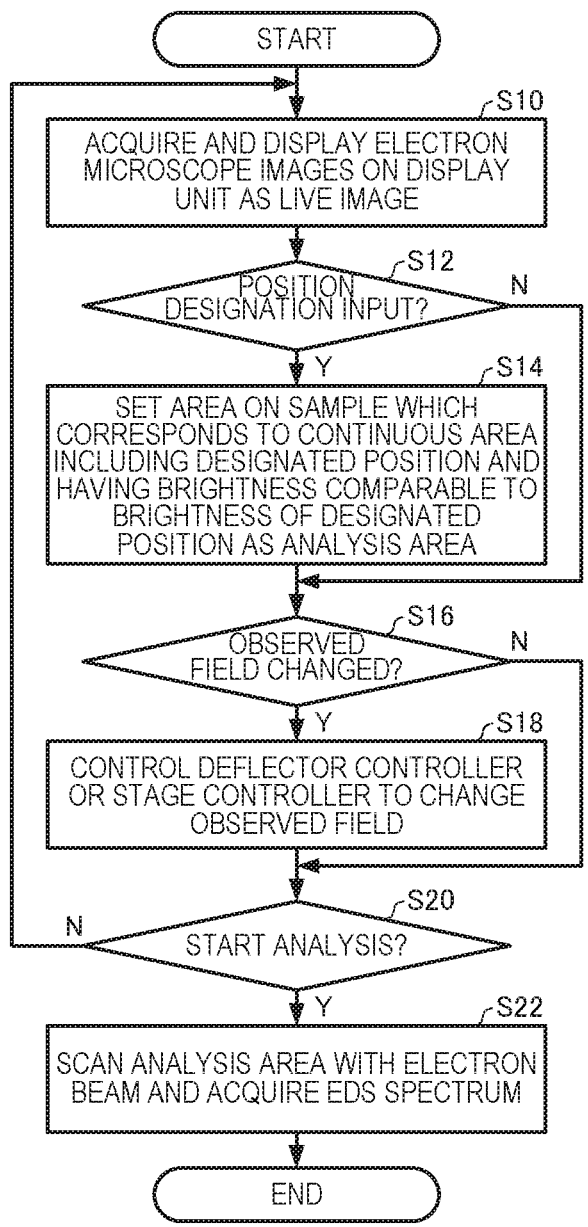
FIG. 5 is a flow chart illustrating an example of processes by an electron microscope according to an embodiment of the invention.

Next, an example of processes by an electron microscope according to one embodiment of the invention will be described with reference to the flow chart illustrated in FIG. 5.

First, the display control unit 101 acquires electron microscope images of the sample S and causes the display unit 120 to display the electron microscope images as the live image LI (step S10).

Next, the analysis area setting unit 102 determines whether or not an input for designating a position on the live image LI has been made (step S12), and when an input has been made (Y in step S12), the analysis area setting unit 102 sets an area on the sample which corresponds to a continuous area including the designated position designated by the input and having brightness comparable to brightness of the designated position as an analysis area and causes coordinate information of the analysis area to be stored in the storage unit 130 (step S14). For example, the analysis area setting unit 102 first sets an area (a pixel) including the designated position on the live image LI as an area which corresponds to the analysis area. Subsequently, when a difference between brightness of the area set as an area which corresponds to the analysis area and brightness of an area adjacent to the set area is equal to or smaller than a predetermined threshold, the adjacent area is set as an area which corresponds to the analysis area and, subsequently, this process is repeated until there are no more areas satisfying this condition (adjacent areas with a brightness difference equal to or smaller than the threshold).

Next, the processing unit 100 determines whether or not an input for changing an observed field has been made (step S16), and when the input has been made (Y in step S16), based on the input, the processing unit 100 performs control for transmitting a control signal to the stage controller 21 to move the observed field or performs control for transmitting a control signal to the deflector controller 20 to change an observation magnification (step S18).

Subsequently, the analysis control unit 103 determines whether or not an input for starting an analysis has been made (step S20). When the input has not been made (N in step S20), a transition is made to step S10. When the input has been made (Y in step S20), the deflector controller 20 or the stage controller 21 is controlled based on the coordinate information of the analysis area stored in the storage unit 130, the analysis area is scanned by an electron beam, and an EDS spectrum based on a detection value of a characteristic X-ray detected during the scanning is acquired (step S22). Moreover, when a plurality of analysis areas are set, in step S22, the plurality of analysis areas are sequentially scanned by an electron beam and EDS spectra of the respective analysis areas are sequentially acquired.

It should be noted that the invention is not limited to the embodiments described above and that various modifications can be made. The invention includes various other configurations which are substantially the same as the configurations described in the embodiments (for example, configurations having the same functions, methods, and results or configurations having the same objectives and effects). In addition, the invention includes various other configurations obtained by replacing nonessential portions of the configurations described in the embodiments. Furthermore, the invention includes various other configurations capable of producing the same effects or configurations capable of achieving the same objectives as the configurations described in the embodiments. Moreover, the invention includes various other configurations obtained by adding known art to the configurations described in the embodiments.

While some embodiments of the invention have been described in detail above, a person skilled in the art will readily appreciate that various modifications can be made without materially departing from the novel teachings and effects of the invention. Accordingly, all such modifications are assumed to be included in the scope of the invention.

What is claimed is:

1. An electron microscope for performing elemental analysis of a sample, the electron microscope comprising:
   a display control unit which sequentially acquires electron microscope images of the sample and causes a display unit to display the electron microscope images as a live image;
   an analysis area setting unit which sets an analysis area on the sample based on a designated position on the live image designated by pointing means; and
   an analysis control unit which performs control for executing elemental analysis of the set analysis area,
   wherein the analysis area setting unit sets, as the analysis area, an area on the sample which corresponds to a continuous area including the designated position and having brightness comparable to brightness of the designated position.

2. The electron microscope according to claim 1, wherein the analysis area setting unit sets, as the analysis area, an area on the sample which corresponds to an area adjacent to an area including the designated position when a difference between brightness of the area including the designated position and brightness of the adjacent area is equal to or smaller than a predetermined threshold.

3. The electron microscope according to claim 2, wherein the analysis area setting unit sets the threshold based on an input by a user.

4. The electron microscope according to claim 1, wherein the analysis control unit scans the set analysis area with an electron beam and acquires a spectrum based on a detection signal of radiation detected during the scan.

5. A control method for controlling an electron microscope which performs elemental analysis of a sample, the control method comprising:
   sequentially acquiring electron microscope images of the sample and causing a display unit to display the electron microscope images as a live image;
   setting an analysis area on the sample based on a designated position on the live image designated by pointing means; and
   performing control for executing elemental analysis of the set analysis area,
   wherein, in setting an analysis area, an area on the sample which corresponds to a continuous area including the designated position and having brightness comparable to brightness of the designated position is set as the analysis area.

* * * * *